March 24, 1970 J. A. NARUD ET AL 3,502,997

INTEGRATED SEMICONDUCTOR CASCODE AMPLIFIER

Filed Oct. 24, 1965

Inventors
JAN. A. NARUD
JAMES E. SOLOMON
BY
Mueller Aichele and Rauner
ATTYS.

3,502,997
Patented Mar. 24, 1970

3,502,997

INTEGRATED SEMICONDUCTOR CASCODE AMPLIFIER

Jan A. Narud and James E. Solomon, Scottsdale, Ariz., assignors to Motorola, Inc., Franklin Park, Ill., a corporation of Illinois

Filed Oct. 24, 1965, Ser. No. 504,497
Int. Cl. H03g *3/30*
U.S. Cl. 330—29 12 Claims

ABSTRACT OF THE DISCLOSURE

Disclosed is an AGC cascode amplifier adapted for fabrication as a monolithic integrated circuit and includes input and output transistors connected in cascode and with different common mode configurations. A control or AGC transistor is emitter coupled in parallel with the output transistor and is connected with the same common mode configuration as the output transistor. An AGC voltage may be applied to the control transistor to differentially vary the currents in the control and output transistors and thereby vary the gain of the amplifier. A diode is connected in parallel with the emitter-base junction of the input transistor and has electrical characteristics which are closely matched to the input transistor. The P and N type regions of the diode have approximately the same doping level as that of the emitter and base regions of the input transistor and this match insures that a substanially constant quiescent current flows in the input transistor.

Figure 1:
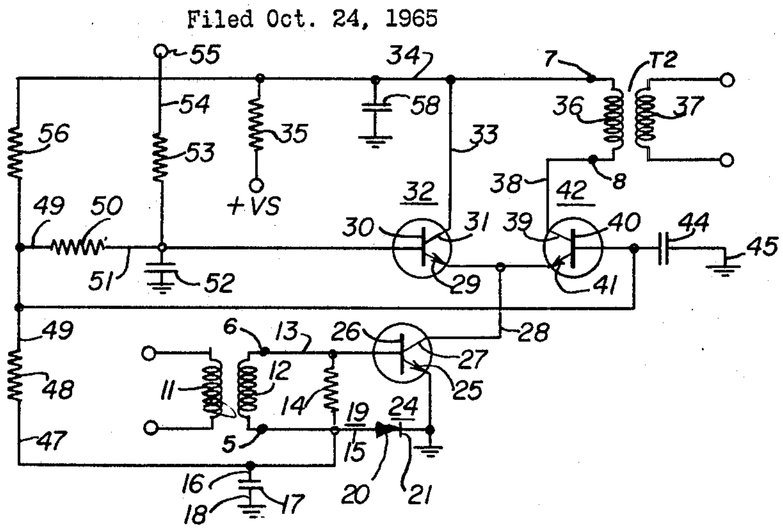

The invention described herein was made under Air Force Contract No. AF 33 (657) 11664 with the Department of the Air Force.

The present invention relates generally to intermediate frequency amplifiers and more particularly to an integrated semiconductor cascode amplifier having improved automatic gain control characteristics.

Known prior art intermediate frequency amplifiers having two or more stages connected in cascode and having an automatic gain control circuit connected to one or more of the stages are operationally disadvantageous in that it is extremely difficult to maintain a constant input impedance and a constant maximum saturation power input to the input stage of the amplifier when the automatic gain control voltage is varied. This is true for circuits built with discrete, active and passive components as well as for integrated semiconductor devices. One example of a prior art amplifier of the type described generally above includes input and output transistors connected in cascade and connected symmetrically with respect to an automatic gain control (AGC) voltage. When the AGC voltage is varied, the resistance of both the input and output transistors is also varied and consequently the input impedance and maximum power input to the input of the amplifier stage is varied with any change in AGC voltage.

The present invention has been designed to overcome the above described disadvantages of prior art IF amplifiers having an automatic gain control circuit. The present invention is directed to an amplifier configuration of input, output and control semiconductor devices connected in such a manner that the amplifier input impedance and input power remain constant with changes in AGC voltage.

Accordingly, it is an object of the present invention to provide a new and improved intermediate frequency amplifier.

Another object of the invention is to provide a solid state amplifier having improved automatic gain control characteristics.

Another object is to provide an intermediate frequency amplifier having improved noise characteristics and pass-band stability.

Another object is to provide an intermediate frequency amplifier which is particularly adaptable to integrated circuit design.

A feature of the invention is the provision of an improved automatic gain control circuit connected to the input and output sections of an intermediate frequency cascode coupled amplifier and operable to vary the current flow in the output section of the amplifier without changing the input impedence of and power input to the input section of the amplifier.

Another feature of the invention is the provision of an improved IF amplifier which is integrally joined to an automatic gain control circuit without the use of coupling capacitors or bias inductors.

Another feature of the invention is the provision of a monolithic integrated semiconductor amplifier circuit having input and output transistors formed on a substrate of semiconductor material and an automatic gain control transistor also formed on the substrate and connected to both said input and output transistors for varying the gain of the amplifier circuit. The gain of the amplifier may be varied without degrading the noise figure and pass-band stability of the amplifier and without the necessity of employing large coupling capacitors in the integrated structure.

The following is a description of the annexed drawing wherein like reference numerals designate corresponding components in the separate figures.

Figure 2:
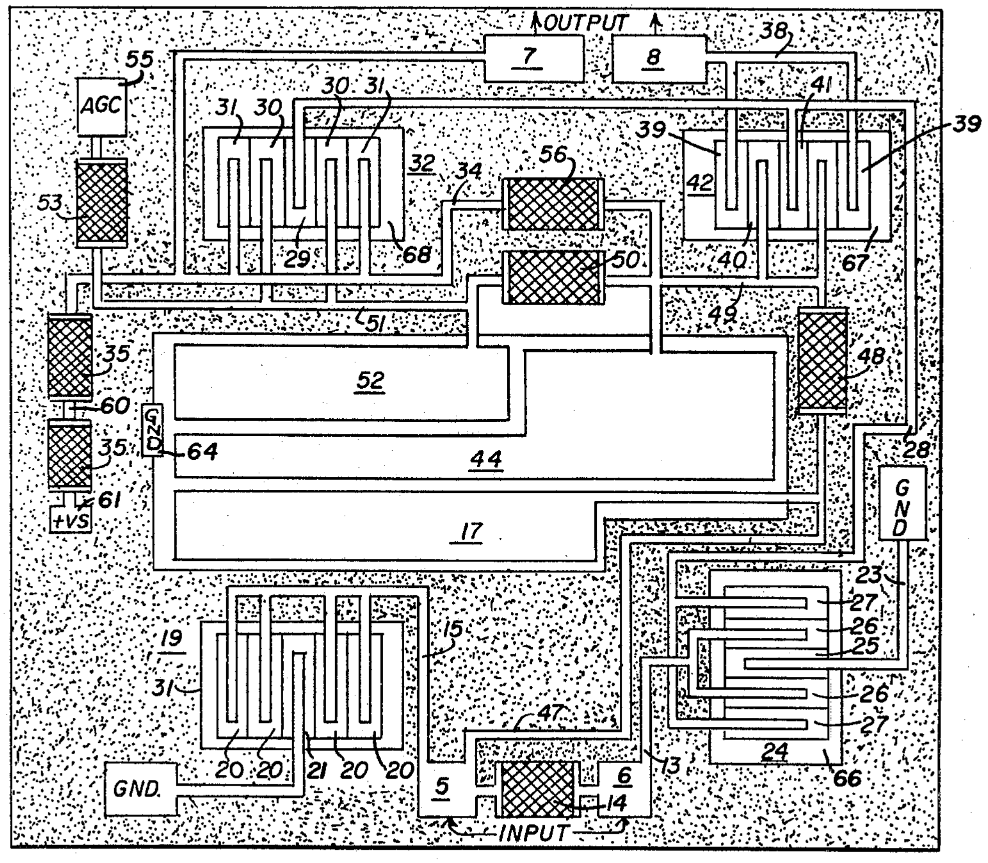

FIG. 1 is a schematic diagram of the IF amplifier according to the present invention; and FIG. 2 is a plan view of the amplifier constructed as a monolithic semiconductor integrated circuit.

Briefly described, the present invention comprises an input semiconductor device connected to a source of input signals and an output semiconductor device connected in cascode with said input semiconductor device and providing an amplification signal path for the input signals. An AGC control circuit is connected in parallel with the output semiconductor device and is connected in a common mode configuration identical to that of said output semiconductor device and different from that of said input semiconductor device. When the AGC voltage is varied in order to vary the gain of the amplifier, the currents flowing in the AGC circuit and in the output semiconductor device are differentially varied whereas the current flow in and resistance of the input semiconductor device remain unchanged. Thus, the input semiconductor device maintains a constant impedance and a constant power input as the gain of the amplifier is varied over a wide range.

One embodiment of the invention is shown in FIG. 1 and includes input transistor 24 which is connected NPN in a common emitter configuration. This transistor is coupled to a source of input signals through transformer windings 11 and 12. A bias resistor 14 is connected in parallel with the transformer winding 12, and diode 19 which is connected between resistor 14 and ground provides a feedback stabilized bias to set the quiescent current in the common emitter bypass capacitor 17. This diode bias arrangement provides a predictable bias with changes in temperature and is practical only with monolithic circuits since the diode must provide a close match to the transistor base-emitter junction. When the current-voltage characteristic of the diode 19 and the emitter base junction of transistor 24 are substantially identical and vary similarly with temperature, it is possible to maintain a constant bias on the emitter-base junction of transistor 24.

A pair of symmetrically coupled transistors 32 and 42 are connected to the collector circuit 28 of input transistor 24, and the NPN transistors 24 and 42 are connected in cascade in a common emitter-common base configuration to form the input and output stages of the IF amplifier. A voltage supply 11 is connected to the collectors of transistors 32 and 42 and an output transformer T2 having windings 36 and 37 is connected in the collector circuit of the output transistor 42. A source of gain control voltage 55 is connected via resistor 53 to the base of AGC transistor 32, and resistors 50 and 53 form a voltage divider for the AGC voltage at the base of transistor 32.

Bypass capacitors 44 and 52 are connected respectively in the bases of transistors 42 and 32 and provide an AC ground for the bases of the two symmetrically coupled transistors. Resistor 35 which forms part of the DC feedback loop provides bias stabilization for the amplifier circuit and acts in conjunction with capacitor 58 to decouple the amplifier stages from the power supply VS.

As the AGC voltage at the base of transistor 32 is increased, the resistance of transistor 32 decreases and the resistance of transistor 42 increases, thereby causing a reduction in output current which is inversely proportional and equal to the current change in transistor 32. Since the sum of the currents flowing in transistors 32 and 42 is equal to the total current flowing in the input transistor 24, there is no net change in the current flowing in transistor 24 and consequently no change of the input impedance of the input transistor 24. When the AGC voltage at the base of transistor 32 decreases, there is a net increase in current flowing in transistor 42 which is equal to the decrease in the current flowing in transistor 32. Thus, the gain of the cascode coupled amplifier stage may be varied without causing any degrading effects on the input stage of the amplifier.

FIG. 2 illustrates the monolithic semiconductor design for a 60 megacycle IF chip and the reference numerals of FIGS. 1 and 2 correspond to identical components in the separate embodiments of the invention.

The monolithic integrated circuit of FIG. 2 is formed in a substrate and the fabrication of transistors 24, 32 and 42 may be accomplished in a well known manner. The N-type conductivity regions of the diode and transistors may be formed in the substrate by masking and then by diffusion, alloying or epitaxial processes. Each of the P and N-type conductivity layers which are subsequently formed on the initial N layer may also be fabricated by masking and then by diffusion, alloying or epitaxial processes.

The input signal from the transformer winding 12 is applied to the input terminals or tabs 5 and 6 between which is coupled resistor 14. A conductive path 15 extends between the tab 5 and the base and collector regions of the transistor diode 19. The collector-base junction of transistor-diode 19 is shorted, and under forward bias conditions the current that flows consists mainly of minority carriers (electrons) injected into the P-type base layer. The N-type emitter 21 of transistor diode 19 is connected through conductor 22 to ground at tab 9.

The input transistor 24 is formed of layers of N and P-type conductivity material, 25 through 27, and the N-type emitter layer 25 is connected to ground at tab 54. The P-type base layer 26 is connected via conductive path 13 to one side of resistor 14, and the N-type collector layer 27 is connected via conductive path 28 to the N-type emitters 29 and 41 in the transistors 32 and 42 respectively.

The P-type conductive base region of transistor 42 is connected via conductive path 49 through resistor 48 to the input pad 5 and one plate of capacitor 17. The path 49 also branches to connect with resistors 50 and 56 located in the base and collector paths respectively of the AGC transistor 32. Also located in these paths are resistors 53 and 35 in the automatic gain control and power supply circuitry respectively. It will be noted that the power supply resistor 35 has an intermediate tab 60 and outer tab 61, thus providing a variation of resistance between voltage supply VS and the collectors of transistors 32 and 42 if desired.

The output tabs 7 and 8 to which the transformer winding 36 and capacitor 58 are connected are conductively connected via paths 38 and 34 respectively to the N-type collectors of transistors 32 and 42. The output transformer T2 and capacitor 58 do not form part of the integrated circuit of FIG. 2.

The three capacitors 17, 44 and 52 are formed from a thin film sandwich of metalization-glass dielectric-metalization and yield approximately 0.3 picofarad per square mil. These capacitors have the same connection with respect to the remaining amplifier circuitry as they did in FIG. 1, and they are isolated at region 63 which is connected to ground at tab 64. Transistors 24, 32 and 42 and the diode 19 are also surrounded by separate isolation regions 65 through 68 respectively.

All resistors shown in FIG. 2 are formed from thin film michrome of 300 ohms per square sheet resistivity. The conductive paths in the circuit are aluminum and are joined to the various circuit components through a layer of silicon dioxide.

In the actual design of the amplifier circuit shown in FIG. 2, the following values were used. The monolithic transistor characteristics given below apply to transistors 24, 32 and 42 and transistor diode 19.

TABLE I

Resistors 48, 50, 56—3 kilohms.
Resistor 35—1 kilohm.
Resistor 53—20 kilohms.
Capacitors 44, 52—100 picofarads.
Capacitor 17—150 picofarads.
Capacitor 58—270 picofarads.
Emitter current—1 milliamp.
Voltage (collector-to-base)—4 volts.
Base spreading Resistance—40 ohms.
Collector-Base Capacitance—1 picofarad.
Substrate-Collector Capacitance—5 picofarads.
Dynamic Emitter Junction Resistance—26 ohms.
Resistor 14—800 ohms.

The above values are given, however, only by way of illustration and should not be construed as limiting the scope of the present invention in any manner.

Thus, the invention described above possesses improved noise and AGC characteristics while exhibiting good pass-band stability and excellent adaptability to integrated circuit design.

We claim:

1. A monolithic integrated semiconductor amplifier circuit including, in combination:

(a) an input and an output transistor connected in cascode and providing a signal path for input signals to be amplified, (b) a control transistor connected symmetrically with respect to and in parallel with said output transistor and having a common mode configuration identical to that of said output transistor and different from that of said input transistor, (c) means for controlling the current flow in said control transistor for varying the current in said output transistor without changing the current flow in said input transistor whereby the gain of said amplifier circuit may be controlled without changing the input impedance of said input transistor, and (d) a semiconductor diode connected in parallel with the emitter-base junction of said input transistor and having P and N type regions with conductivity characteristics substantially identical to the conductivity characteristics of the P and N type regions of the base and emitter, respectively, of said input transistor, said P and N type regions fabricated adjacent each other on an integrated circuit chip, whereby the emitter quiescent current in said input transistor is substantially equal to said diode current over a wide range of temperatures so that said diode provides excellent temperature compensation for said input transistor.

2. The integrated circuit according to claim 1 wherein:

(a) said input transistor is connected in series with said control and output transistors and carries a total current equal to the sum of the currents flowing in said control and output transistors, and (b) said controlling means includes means for varying the bias on said control transistor for differentially varying the current flow in said control and output transistors.

3. The circuit according to claim 2 which further includes:

(a) a voltage supply terminal, and (b) circuit means connected between said voltage supply terminal and said input transistor for providing a forward bias on said input transistor.

4. The integrated circuit according to claim 3 wherein:

(a) each of said transistors has an emitter, a base and a collector, (b) said collector of said control and output transistors being coupled to a voltage supply terminal, (c) a voltage divider network connected between said automatic gain control means and the base of said control transistor for varying the bias thereon, and (d) means for coupling an output signal from the collector of said output transistor.

5. A monolithic integrated semiconductor amplifier circuit including in combination:

(a) an input transistor having an emitter, a base and a collector and connected to receive input signals to be amplified, (b) an output transistor having an emitter, a base and a collector and connected in cascode with said input transistor, said input and output transistors providing a signal path through said amplifier circuit, (c) a control transistor having an emitter, a base and a collector and connected symmetrically with respect to and in parallel with said output transistor, (d) a PN semiconductor device connected in parallel with the emitter-base junction of said input transistor and having P and N type regions thereof with conductivity characteristics substantially identical to the conductivity characteristics of the P and N type regions of said input transistor, said PN semiconductor device undergoing voltage variations with temperature substantially identical to the temperature induced voltage variations of the emitter-base junction of said input transistor to thereby maintain a substantially constant quiescent current into said input transistor, and (e) means for connecting an automatic gain control voltage to said control transistor for varying the gain of said amplifier circuit.

6. The amplifier circuit defined in claim 5 wherein the emitter of said input transistor is connected to ground, and said PN semiconductor device connected between ground and the base of said input transistor to thereby set the class A operating point of said input transistor.

7. The amplifier circuit defined in claim 5 which further includes:

(a) a voltage divider connected between a voltage supply terminal and said input transistor, said voltage divider having an intermediate point thereon connected to said control and output transistors for establishing the DC operating levels thereat, and (b) a resistor connected between said PN semiconductor device and the base of said input transistor for providing a slight forward bias on said input transistor.

8. The amplifier circuit defined in claim 7 which further includes (a) first and second RF bypass capacitors connected between the bases of said control and output transistors, respectively, and ground potential for providing an AC ground at the bases of said control and output transistors, (b) means for inductively coupling an input signal to be amplified between said diode and the base of said input transistor, and (c) means for inductively coupling an output signal from the collector of said output transistor.

9. The amplifier defined in claim 8 which further includes a desensitizing resistor 23 connected between the bases of said control and output transistors, said desensitizing resistor minimizing the dependence of said output transistor on beta variations in said control transistor and of variations in the gain control voltage level at the base of said control transistor.

10. A monolithic integrated semiconductor amplifier circuit including in combination:

(a) an input transistor having an emitter, a base and a collector and connected to receive input signals to be amplified, (b) an output transistor having an emitter, a base and a collector and connected in cascode with said input transistor, (c) a control transistor having an emitter, a base and a collector and connected symmetrically with respect to and in parallel with said output transistor, and (d) a desensitizing resistor connected between the bases of said control and output transistors, said desensitizing resistor minimizing the dependence of said output transistor on beta variations in said control transistor and of variations in the gain control voltage level at the base of said control transistor.

11. The monolithic integrated semiconductor amplifier circuit defined in claim 10 which further includes:

(a) a voltage divider connected between a voltage supply terminal and said input transistor, said voltage divider having an intermediate point thereon connected to said control and output transistors for establishing the DC operating levels thereat, and (b) a resistor connected between said voltage divider and the base of said input transistor for providing a slight forward bias on said input transistor.

12. The monolithic integrated semiconductor amplifier circuit defined in claim 11 which further includes:

(a) first and second RF bypass capacitors connected between the bases of said control and output transistors respectively and ground potential for providing an AC ground at the bases of said control and output transistors, (b) means for inductively coupling an input signal to be amplified into the base of said input transistor, and (c) means for inductively coupling an output signal from the collector of said output transistor.

References Cited

UNITED STATES PATENTS

| | | | |
|---|---|---|---|
| 3,194,985 | 7/1965 | Smith et al. | 330—30 X |
| 3,210,683 | 10/1965 | Pay | 330—30 X |
| 3,241,078 | 3/1966 | Jones | 330—69 X |
| 3,290,520 | 12/1966 | Wennik | 330—30 X |
| 3,368,156 | 2/1968 | Kam | 330—29 X |

FOREIGN PATENTS

| | | |
|---|---|---|
| 1,141,338 | 12/1962 | Germany. |

OTHER REFERENCES

Pacifico and King, "Integrated Circuits Shrink A Doppler Radar System," Electronics, Mar. 23, 1964, pp. 74–79.

ROY LAKE, Primary Examiner

L. J. DAHL, Assistant Examiner

U.S. Cl. X.R.

330—38